United States Patent
Lappe et al.

(10) Patent No.: US 10,404,242 B1
(45) Date of Patent: Sep. 3, 2019

(54) HIGH POWER RF LIMITER

(71) Applicant: Rockwell Collins, Inc., Cedar Rapids, IA (US)

(72) Inventors: Timothy S. Lappe, Marion, IA (US); John J. Jorgenson, Cedar Rapids, IA (US); Jeffrey D. Schmidt, Marion, IA (US); Joseph F. Jiacinto, Mount Vernon, IA (US); Steven R. Brown, Vinton, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 253 days.

(21) Appl. No.: 15/448,372

(22) Filed: Mar. 2, 2017

(51) Int. Cl.
| | |
|---|---|
| H02H 9/00 | (2006.01) |
| H01P 1/22 | (2006.01) |
| H03G 11/04 | (2006.01) |
| G01R 1/36 | (2006.01) |
| H03G 11/02 | (2006.01) |
| H03K 5/08 | (2006.01) |
| H03K 17/60 | (2006.01) |
| H03K 5/1252 | (2006.01) |

(52) U.S. Cl.
CPC ............. *H03K 5/08* (2013.01); *H03K 5/1252* (2013.01); *H03K 17/60* (2013.01)

(58) Field of Classification Search
CPC ......... H03K 5/08; H03K 5/1252; H03K 17/60
USPC ................................................ 327/100–333
See application file for complete search history.

(56) References Cited

U.S. PATENT DOCUMENTS

| | | | | |
|---|---|---|---|---|
| 5,300,900 | A * | 4/1994 | Bellantoni | H03G 11/025 327/309 |
| 9,391,352 | B2 * | 7/2016 | Forster | H03G 11/002 |
| 2010/0079921 | A1 * | 4/2010 | Fujita | G06K 19/0701 361/56 |
| 2010/0277839 | A1 * | 11/2010 | Nicholson | G01R 1/36 361/54 |
| 2011/0255204 | A1 * | 10/2011 | Satomi | H03G 11/025 361/111 |
| 2014/0125545 | A1 * | 5/2014 | Forster | H03G 11/002 343/850 |

* cited by examiner

*Primary Examiner* — Brandon S Cole
(74) *Attorney, Agent, or Firm* — Angel N. Gerdzhikov; Donna P. Suchy; Daniel M. Barbieri

(57) ABSTRACT

A two-stage high-power RF limiter circuit for an RF signal receiver incorporates a heavy limiting stage to limit high energy pulses of a received RF signal to a desired power threshold over a sustained time period, while a light limiting stage reacts quickly to high energy pulses to reduce spike leakage associated with the slower reaction time of the heavy limiting stage. Both heavy and light limiting stages incorporate PIN diodes biased to a voltage just below the desired power threshold (the light limiter biased to a slightly higher voltage than the heavy limiter) so the PIN diodes do not activate until power levels are high enough to warrant limiting. The holdoff voltage across the PIN diodes is maintained by Zener diodes biased to a voltage corresponding to the power threshold, allowing the PIN diodes to self-bias once the power threshold is reached.

20 Claims, 11 Drawing Sheets

214 — Generating at least one second RF output signal based on the first RF output signal by reducing spike leakage associated with the at least one first rectifier diode via at least one second rectifier diode of the limiter circuit, the at least one second rectifier diode biased to a second holdoff voltage between the first holdoff voltage and the threshold voltage by the external DC voltage source 216 — Maintaining a second holdoff voltage across the at least one second rectifier diode via a second holdoff circuit of the limiter circuit, the second holdoff circuit associated with a second threshold voltage greater than the first threshold voltage 218 — Outputting the at least one second RF output signal via the at least one RF output

HIGH POWER RF LIMITER

BACKGROUND

Radio frequency (RF) signaling devices, from satellite-based navigational receivers to cell phones to ruggedized military radios, may be subject to very high power RF pulses during operation. As radios have developed, the hardware must support wider frequency bandwidths while maintaining protection for very sensitive receiver components. Damage due to exceeding voltage thresholds may occur very quickly, causing complete radio failure at any of several single points along the RF chain. Because the radios may cover multiple octaves of bandwidth, a coarse/fine passive limiter design does not provide a feasible solution. Similarly, while clipper circuits may be scalable and may react quickly to positive or negative alternating-current (AC) voltages associated with the RF signal, their speed comes at the cost of low power limitations. Active limiter circuits may be sufficiently high-power and sufficiently fast; however, the circuits may incorporate couplers, which may become prohibitively large at very high (VHF) frequencies and limit the versatility of the circuit over very wide band frequency ranges. Additionally, RF detector response flatness may become a concern that must be compensated.

SUMMARY

In one aspect, embodiments of the inventive concepts disclosed herein are directed to a high-power RF limiter circuit configured for limiting high-energy pulses of an RF input signal to a desired power level. The limiter circuit may include one or more rectifier diodes for limiting the high-energy pulses, the rectifier diodes biased to a holdoff voltage just below a threshold voltage corresponding to the desired power level. The limiter circuit may include a holdoff circuit for maintaining the holdoff voltage across the rectifier diodes until the power levels of the RF signal are sufficient to warrant turning on the diodes. The holdoff circuit may incorporate Zener diodes rated to the threshold voltage, or similar means of maintaining the holdoff voltage across the rectifier diodes once power levels exceed the threshold level and the rectifier diodes have switched on. In embodiments, the limiter circuit may include an additional light limiter stage, similar to the limiter circuit but biased to a slightly higher voltage and configured to quickly turn on and reduce spike leakage associated with the first, or heavy, limiter stage.

In a further aspect, embodiments of the inventive concepts disclosed herein are directed to a method for high-power limiting of an RF input signal. The method may include determining a desired power threshold to which the input signal will be limited, and a corresponding voltage threshold. The method may include biasing a first PIN diode of a limiter circuit to a bias voltage slightly lower than the voltage threshold. The method may include biasing a second PIN diode of the limiter circuit to a second bias voltage greater than the first bias voltage. The method may include receiving the RF input signal via the limiter circuit. The method may include generating a first RF output signal based on the RF input signal by activating the first PIN diode via a first holdoff circuit once the voltage threshold is reached. The method may include generating a second RF output signal based on the first RF output signal by activating the second PIN diode via a second holdoff circuit biased to a voltage slightly above the voltage threshold, reducing spike leakage associated with the activation of the first PIN diode. The method may include outputting the second RF signal via an RF output of the limiter circuit.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 5A and 5B illustrate an exemplary embodiment of a method according to the inventive concepts disclosed herein.

DETAILED DESCRIPTION OF EXEMPLARY EMBODIMENTS

Figure 1:
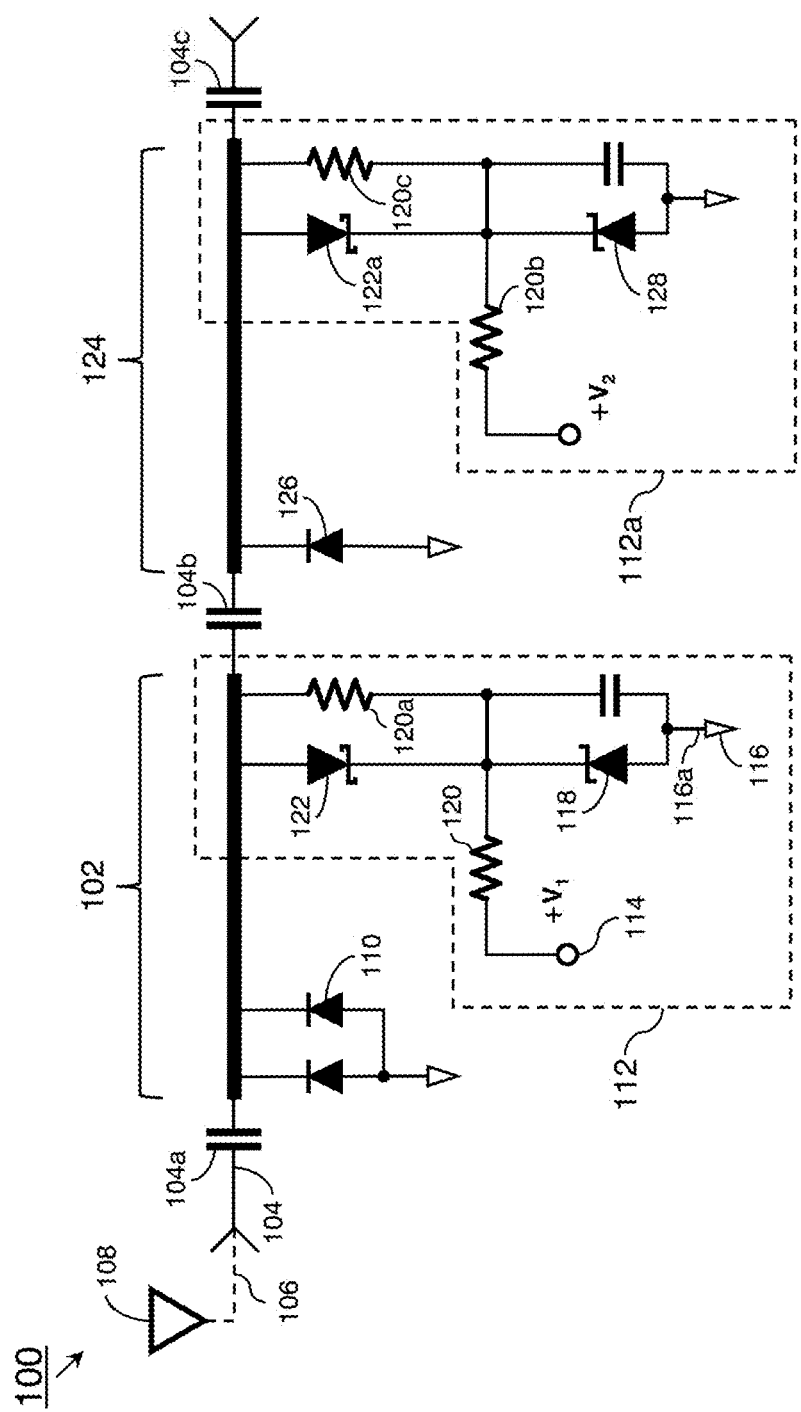
FIG. 1 illustrates an exemplary embodiment of a high-power RF limiter circuit according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a high-power radio-frequency (RF) limiter circuit and related method. The limiter circuit provides a quick-reacting means of protecting sensitive internal components of a receiver from high-energy pulses in received RF signals. These high-energy pulses can quickly exceed voltage thresholds and lead to complete radio failure at any of various points along the receiver chain. The RF limiter circuit provides a scalable solution with favorable size, weight, power, and cost (SWaP-C) metrics.

Referring now to FIG. 1, an exemplary embodiment of a high-power RF limiter 100 according to the inventive concepts disclosed herein may include a limiting circuit 102 in the same electrical plane as the RF transmission line 104 through which an inbound RF input signal (106) may flow upon receipt by an antenna 108 or antenna element of a receiver device within which the limiter circuit 100 is embodied. For example, the limiting circuit 102 may include one or more PIN diodes 110 (e.g., rectifier diodes, limiting diodes) and a holdoff circuit 112. The PIN diodes 110 may be biased (e.g., via an external high-impedance DC bias network or voltage source 114) to a holdoff voltage just below a voltage threshold corresponding to the desired power threshold to which the RF input signal 106 (inbound via the RF transmission line 104) will be limited, thus preventing the PIN diodes 110 from activating before the RF power of the incoming RF input signal 106 reaches a level sufficient to warrant limiting. Before the limiter circuit 102 is activated, the PIN diodes 110 may be held off and the limiter circuit may resemble a high impedance to ground (116), resulting in a small insertion loss to the system 100 without additional noise generation. Once the desired power threshold (e.g., the limiting threshold of the inbound RF input signal) has been exceeded and the PIN diodes 110 are switched on, the holdoff circuit 112 may maintain the holdoff voltage across the PIN diodes 110. For example, the holdoff circuit 112 may include a Zener diode 118 rated at a voltage ($V_1$) corresponding to the voltage threshold and the desired power threshold (e.g., just above the holdoff voltage to which the PIN diodes 110 are biased), such that the Zener diode 118 (likewise biased to the holdoff voltage by the DC bias network 114) is held off, but able to quickly activate, at lower RF power levels. The holdoff circuit 112 may include cut-in resistors 120 for addressing cut-in impact (maintaining the holdoff voltage across the PIN diodes 110 during the initial drop in RF power associated with the first few cycles of the RF input signal 106 limited by the PIN diodes 110) and high-impedance resistors 120a for preventing high-power RF signals from reaching the DC path to ground (116a). The holdoff circuit 112 may include a Schottky diode 122 for absorbing reverse leakage from the Zener diode 118, isolating the RF input signal 106 from the capacitive effects of the Zener diode and providing a DC path to ground (116a) for the PIN diodes 110 to self-bias to the holdoff voltage once the desired power threshold is reached.

The high-power RF limiter 100 may be a two-stage or multi-stage limiter incorporating the limiting stage 102 (which serves as a heavy limiter) and a light limiter (light limiting stage) 124 in the same electrical plane as the RF transmission line 104. The light limiter 124 may be generally implemented and may function similarly to the heavy limiter 102, except that while the heavy limiter 102 may activate first to handle the dissipation of high-power pulses of the RF input signal 104 for sustained durations, the light limiter 124 may react more quickly to the leading edge of a high-energy pulse, reducing spike leakage (e.g., video leakage) associated with the slower reaction of the heavy limiter 102. For example, when a high power energy pulse of the inbound RF input signal 106 (via the RF transmission line 104) engages the high-power RF limiter 100, the heavy limiter 102 may activate first but react relatively slowly, due to the thicker intrinsic regions (not shown) of its component PIN diodes 110. The light limiter 124, however, may incorporate one or more PIN diodes 126 having a thinner intrinsic region than those of the PIN diodes 110, allowing the light limiter 124 to switch on more quickly than the heavy limiter 102. The light limiter 124 may be less suitable for long-term power dissipation than the heavy limiter 102; accordingly, the light limiter 124 (in particular, the PIN diodes 126 and Zener diodes (128) of the light limiter) may be biased to a holdoff voltage slightly higher than the voltage threshold ($V_1$) associated with the heavy limiter 102, and the Zener diodes 128 of the light limiter 124 may have a slightly higher rated voltage ($V_2$). The light limiter 124 may dissipate power only while the heavy limiter 102 is turning on, reducing spike leakage associated with the heavy limiter 102 and protecting receiver components before the PIN diodes 110 of the heavy limiter 102 can begin dissipating power. The light limiter 124 may include a holdoff circuit (112a) for maintaining the holdoff voltage across the PIN diodes 126 via the Zener diode 128; similarly to the holdoff circuit 112 of the heavy limiter 102, the holdoff circuit 112a may include cut-in resistors (120b), high-impedance resistors (120c) and Schottky diodes (122a).

The heavy limiter 102 and light limiter 124, as well as input and output ports along the RF transmission line 104, may be separated by decoupling capacitors 104a-c. With the proper selection of diodes and capacitors, the high-power RF limiter 100 may easily handle RF input signals (106) throughout the RF spectrum, including the HF, VHF, and UHF bands (3 MHz-3 GHz). In embodiments, the high-power RF limiter 100 may incorporate further light limiting stages, which may be implemented and may function similarly to the light limiter 124, electrically connected to the light limiter for still further reduction of spike leakage beyond that achieved by the light limiter.

Figure 2A:
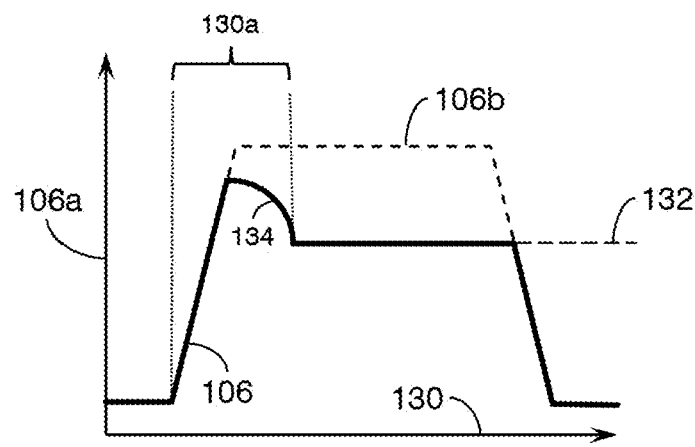
FIGS. 2A through 2C illustrate operations of the high-power RF limiter circuit of FIG. 1.
Figure 2B:
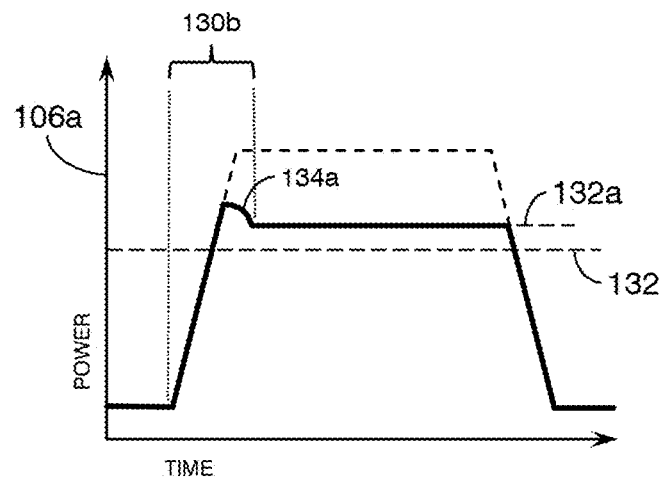
Figure 2C:
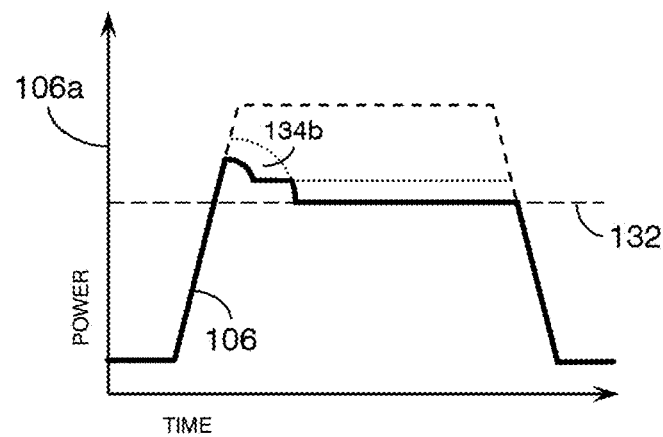

Referring now to FIGS. 2A through 2C, the effect on the power level (106a) of an RF input signal 106 over time (130) by, respectively, the heavy limiter 102 of FIG. 1, the light limiter 104 of FIG. 1, and the two-stage limiter circuit 100 is shown.

Referring in particular to FIG. 2A, the RF input signal 106 may include one or more high energy pulses (106b) capable of damaging receiver components. For example, the heavy limiter (102, FIG. 1) may limit the power level (106a) of the RF input signal 106 to the desired power threshold (132) over a sustained time period (130). However, the slow reaction time (130a) of the heavy limiter 102 may result in spike leakage (134) while the PIN diodes (110, FIG. 1) of the heavy limiter 102 are turning on.

Referring now to FIG. 2B, the light limiter (124, FIG. 1) may be biased to a slightly higher voltage threshold (132a) than the desired power threshold (132, FIG. 2A). As the PIN diodes (126, FIG. 1) of the light limiter 124 have a faster reaction time (130b) than the PIN diodes 110 of the heavy limiter 102, the light limiter 124 reaches its voltage threshold (132a) with a significant reduction in spike leakage (134a).

Referring also to FIG. 2C, the combined output of the heavy limiter 102 and the light limiter 124 (as shown by FIGS. 2A and 2B respectively) effectively limits the power level (106a) of the RF input signal 106 to the desired power threshold (134) with a reduction in spike leakage (134b).

Figure 3A:
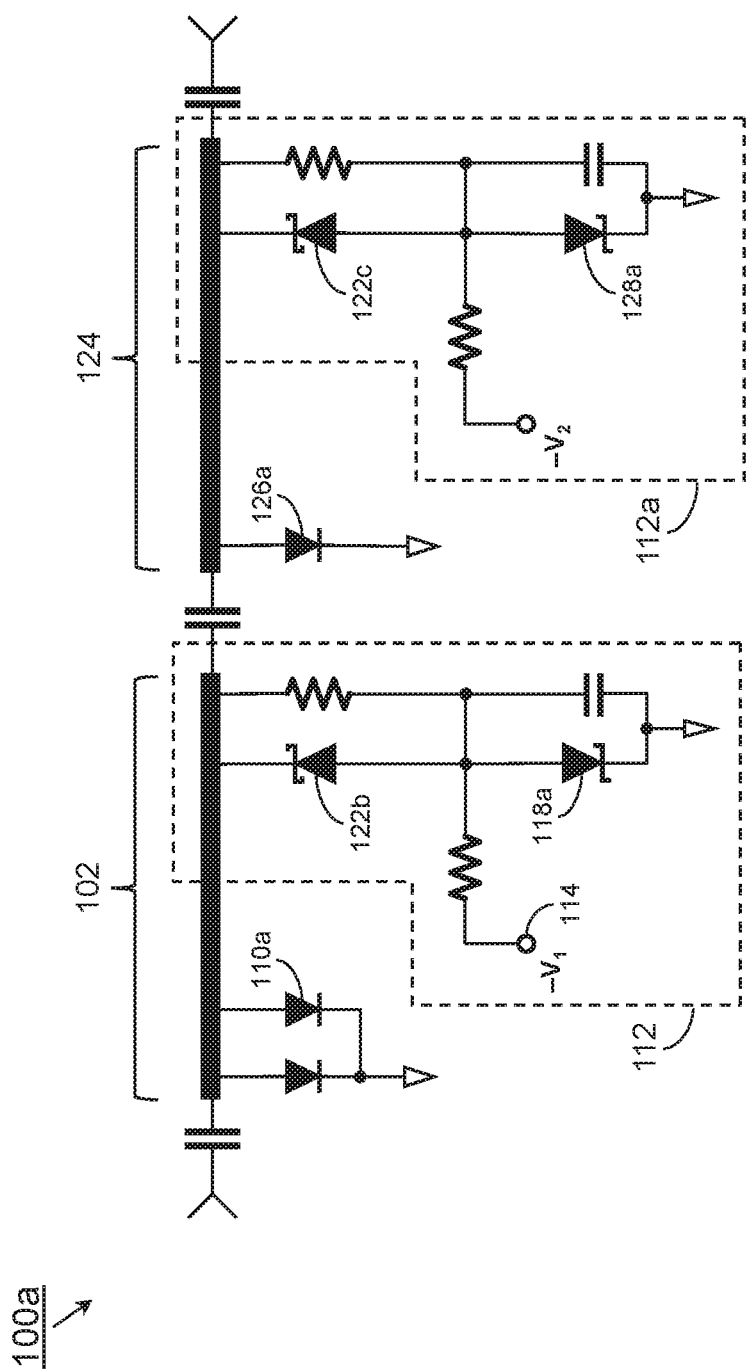
FIG. 3A illustrates the high-power RF limiter circuit of FIG. 1 configured for negative bias voltage.

Referring now to FIG. 3A, a high-power RF limiter 100a may be implemented and may function similarly to the high-power RF limiter 100 of FIG. 1, except that the high-power RF limiter 100a may be configured for biasing to a negative bias voltage (via the DC bias network 114) by reversing the polarity of the PIN diodes (110a, 126a), the Zener diodes (118a, 128a), and the Schottky diodes (122b, 122c) of the respective holdoff circuits 112, 112a of the heavy limiter 102 and the light limiter 124.

Figure 3B:
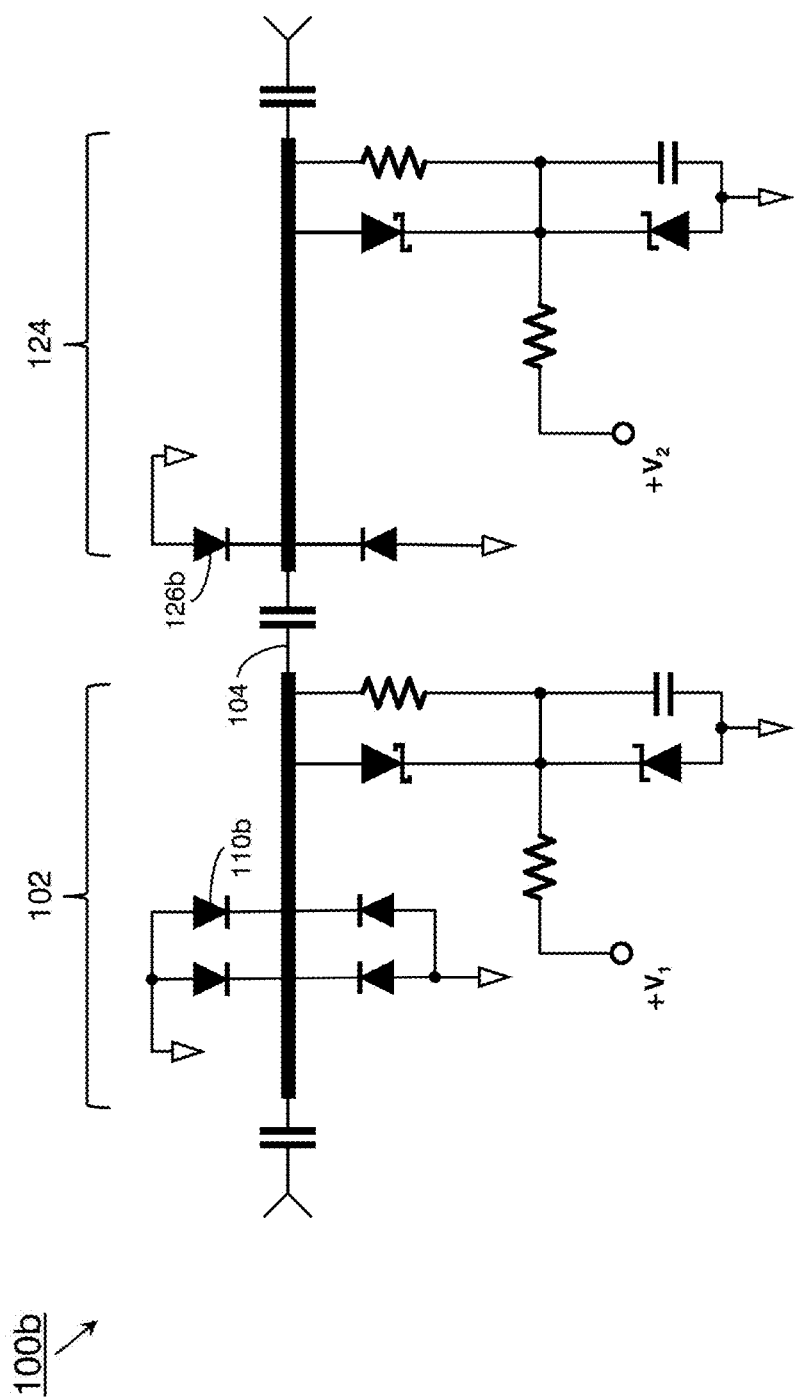
FIG. 3B illustrates the incorporation of additional limiter diodes into the high-power RF limiter circuit of FIG. 1.

Referring now to FIG. 3B, a high-power RF limiter 100b may be implemented and may function similarly to the high-power RF limiter 100a of FIG. 3A, except that the high-power RF limiter 100b may include a heavy limiter 102 incorporating additional PIN diodes (110b). For example, the additional PIN diodes (110b) may be co-located on the RF transmission line 104, electrically offset from the RF transmission line via one or more stub transmission lines, or both. The light limiter 124 may include additional PIN diodes (126b) in a similar fashion.

Figure 4A:
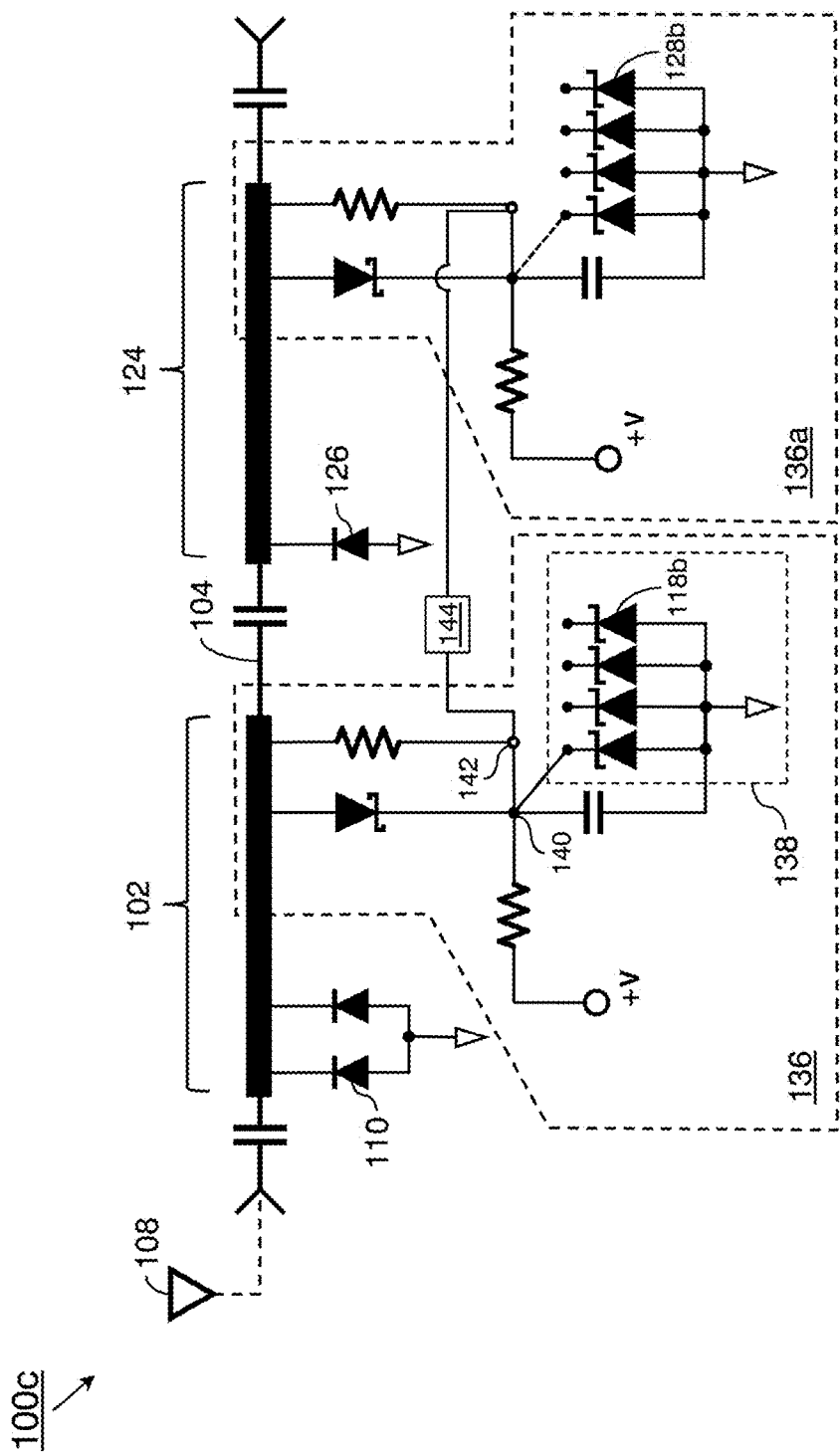
FIG. 4A illustrates an exemplary embodiment of a scalable high-power RF limiter circuit according to the inventive concepts disclosed herein.

Referring now to FIG. 4A, a high-power RF limiter 100c may be implemented and may operate similarly to the high-power RF limiter 100b of FIG. 3B, except that the high-power RF limiter 100c may be a software-controllable limiter circuit capable of selecting any of a number of limit levels depending on internal or environmental needs, e.g., a variety of receiver paths using a single antenna port (108), each receiver path associated with a different capacity for handling high power interferers, or an actively configurable limiter capable of adjusting the performance of the high-power RF limiter 100c depending on different waveforms, threats, or operating environments.

For example, the heavy limiter 102 of the high-power RF limiter 100c may include a scalable holdoff circuit 136 comprising a bank (138) of Zener diodes (118b) connected to the RF transmission line 104 by a switch 140 and a voltage monitor (142) for determining the current bias voltage and reporting voltage determinations (or power levels corresponding to determined voltages) to a limiter controller 144. The limiter controller 144 may be any appropriate analog controller or a digital signal processor (DSP). Status determinations by the voltage monitor 144 may be used by the limiter controller 144 to optimize the performance of the high-power RF limiter 100c via switching front-end attenuation, switching between low-sensitivity and high third-order intercept point (IP3) receiver paths, switching between antennas, enabling or adjusting additional PIN diodes 110, 126 or clamping circuits (not shown), and/or changing bands of operation. For example, the limiter controller 144 may detect a periodicity of high-energy pulses of the RF input signal (106, FIG. 1) and adjust the operation of the high-power RF limiter 100c to anticipate future high-energy pulses. Each individual Zener diode 118b of the heavy limiter 102 may be rated to a voltage corresponding to a selectable power threshold, as well as a counterpart Zener diode 128b of the light limiter 124 (having a counterpart diode voltage slightly greater than that of the voltage of its counterpart Zener diode 118b of the heavy limiter 102) of the scalable holdoff circuit 136a of the light limiter 124.

Figure 4B:
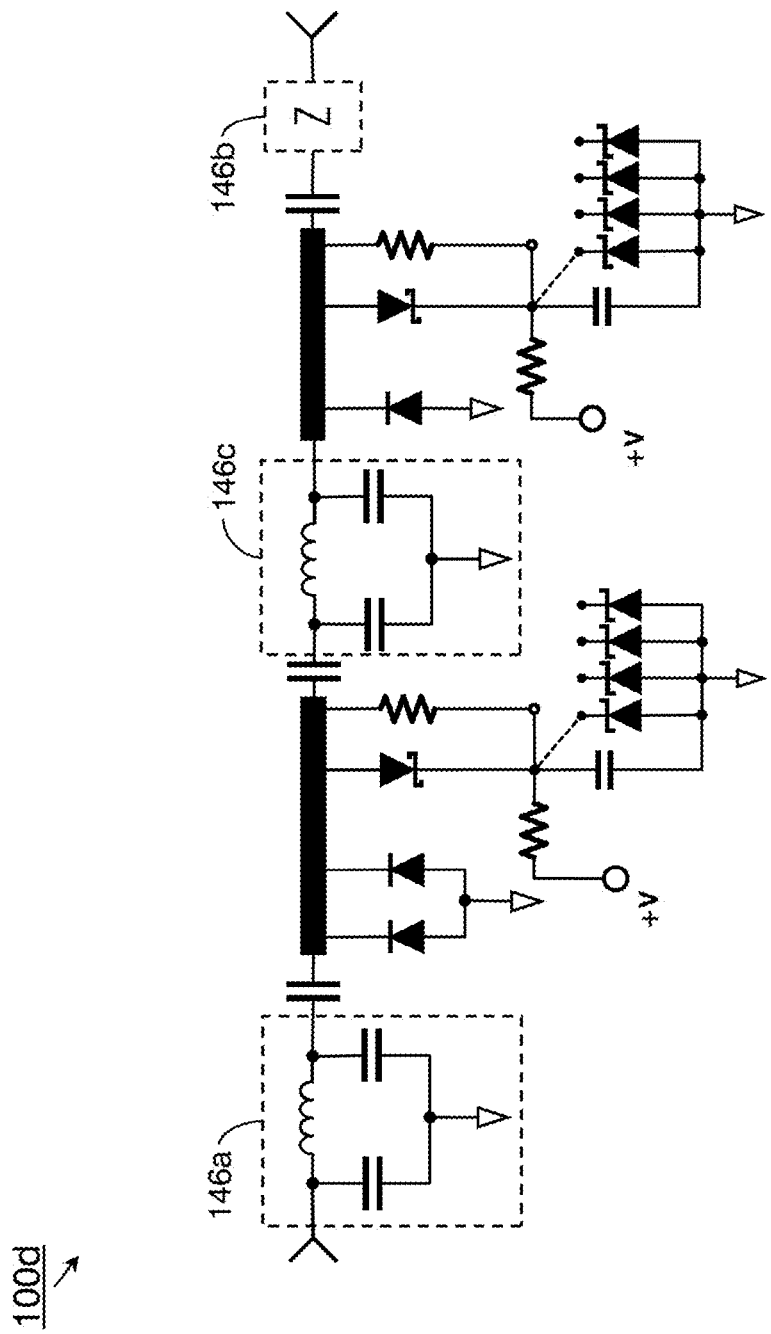
FIG. 4B illustrates the incorporation of impedance matching networks into the scalable high-power RF limiter circuit of FIG. 4A.

Referring now to FIG. 4B, the high-power RF limiter 100d may be implemented and may operate similarly to the high-power RF limiter 100c of FIG. 4A (or to the high-power RF limiter 100 of FIG. 1), except that the high-power RF limiter 100d may include one or more external impedance matching networks 146a-b and intra-stage impedance matching networks 146c. The impedance matching networks 146a-c may include, for example, various combinations of capacitors and inductors configured for tuning the high-power RF limiter 100d (as directed by the limiter controller 144 (FIG. 4A)) for lower insertion loss, wider bandwidth, and/or lower leakage via impedance transformation.

Figure 4C:
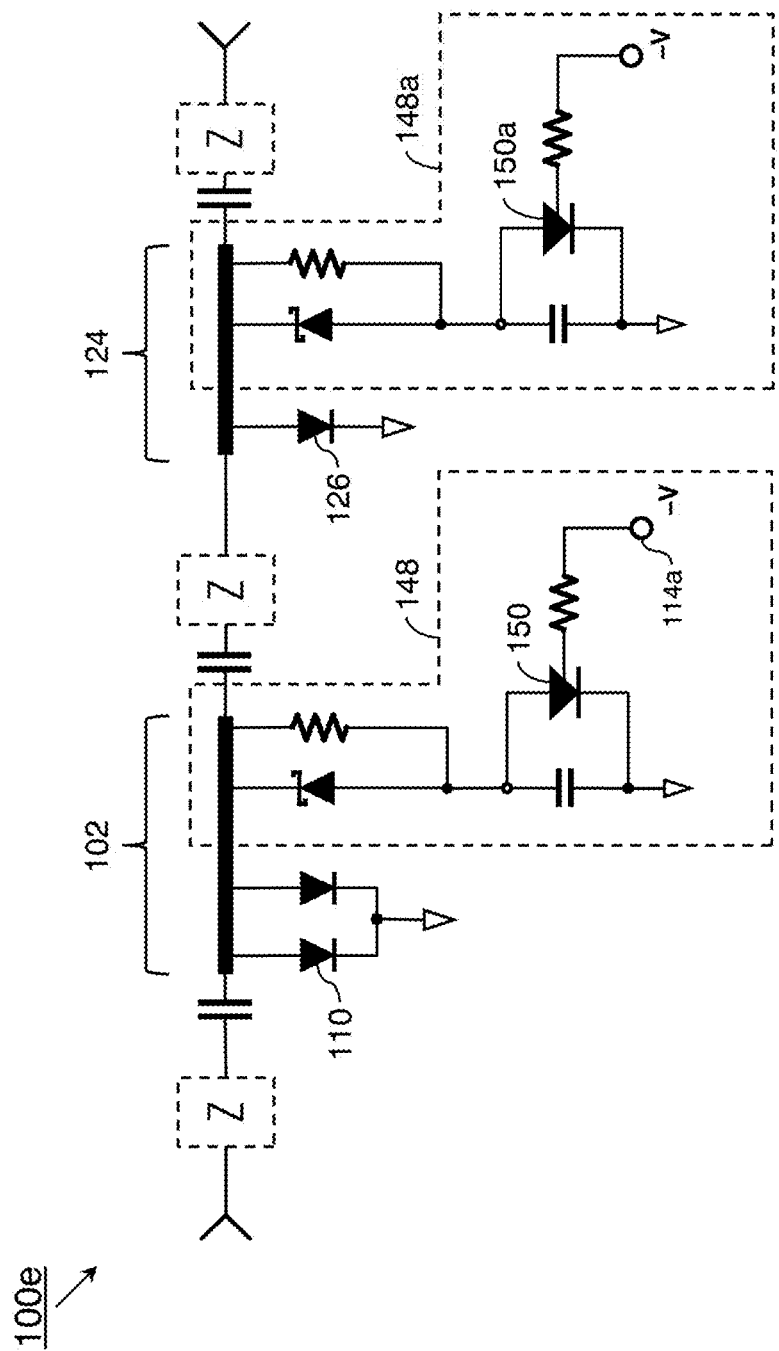
FIGS. 4C through 4F illustrate alternative implementations of the scalable high-power RF limiter circuit of FIG. 4A.

Referring now to FIG. 4C, the high-power RF limiter 100e may be implemented and may operate similarly to the high-power RF limiter 100d of FIG. 4B, except that the high-power RF limiter 100e may incorporate shunt regulator circuits 148, 148a in the heavy limiter 102 and light limiter 124 respectively, for maintaining the holdoff voltage (e.g., a selectable negative voltage via the DC bias network 114a) across the PIN diodes 110, 126 until the desired power threshold (132/132a, FIGS. 2A/B) is reached. For example, the shunt regulator circuits 148, 148a may incorporate Zener diodes 150, 150a as shunt regulators.

Figure 4D:
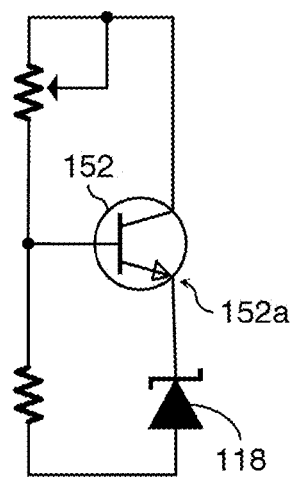
Figure 4E:
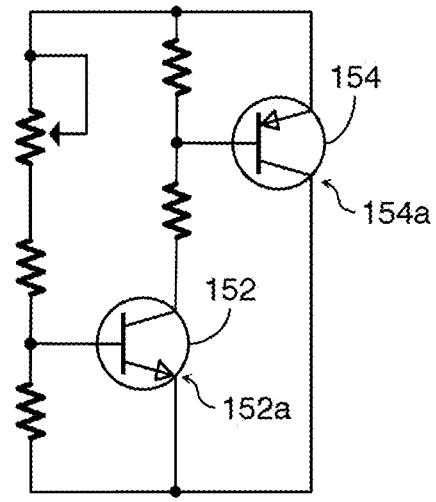

Referring now to FIGS. 4D and 4E, the holdoff circuits 148b-c may be implemented and may function similarly to the shunt regulator circuits 148, 148a of FIG. 4C, except that the holdoff circuits 146b-c may incorporate other components to maintain the holdoff voltage across the PIN diodes 110, 126 (FIG. 4C) until the desired power threshold (132/132a, FIGS. 2A/B) is reached, while allowing the PIN diodes 110, 124 to self-bias after the desired power threshold is reached. For example, the holdoff circuit 148b may incorporate, in addition to a Zener diode 118, an NPN bipolar junction transistor 152 (BJT) serially connected to the Zener diode via its emitter 152a. Similarly, the holdoff circuit 148c may incorporate, in place of the Zenor diode 118 of the holdoff circuit 148b, an NPN BJT 152 connected in parallel to a PNP BJT 154 (e.g., the emitter 152a of the NPN BJT 152 may be electrically connected to a collector 154a of the PNP BJT 154).

Figure 4F:
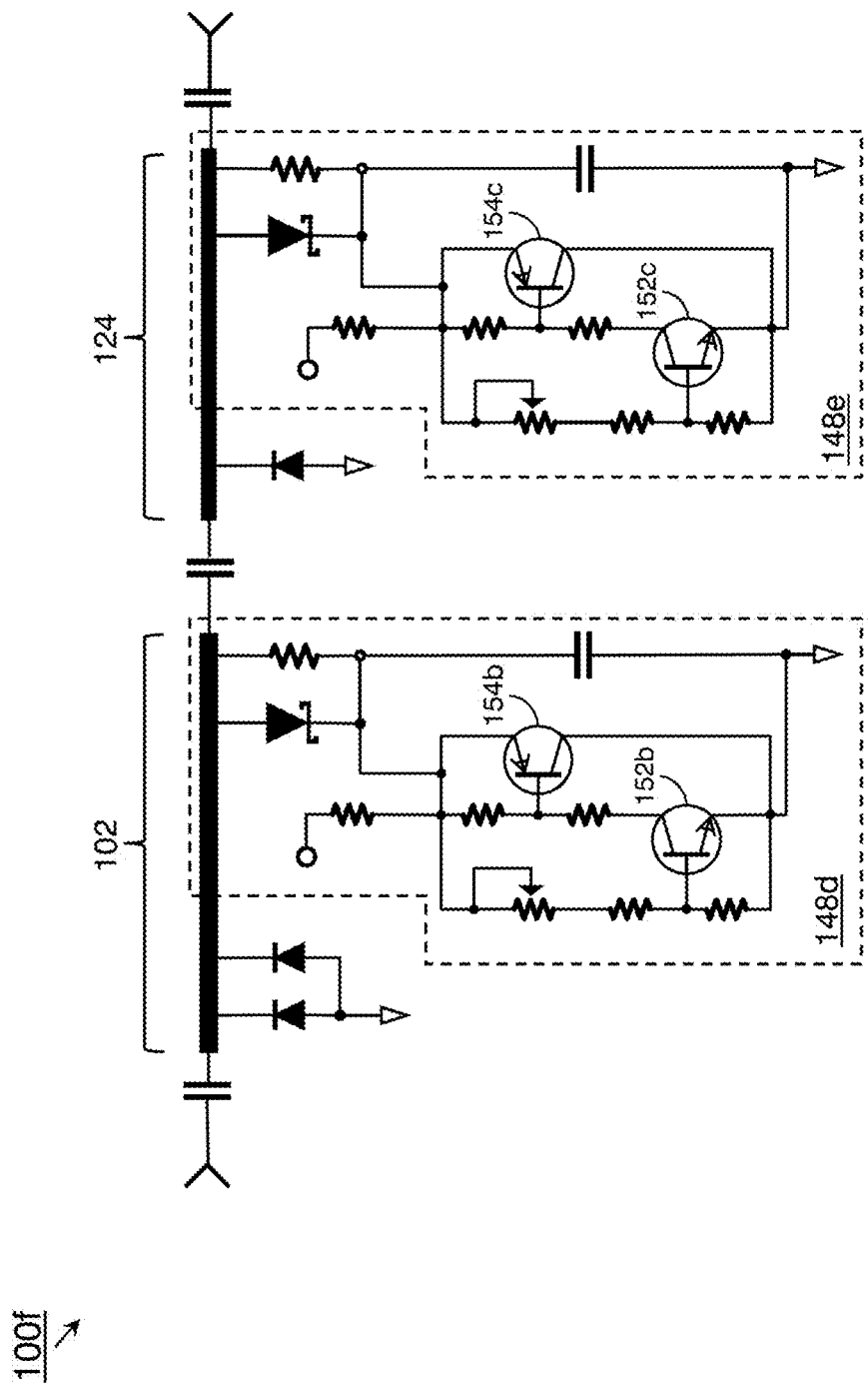

Referring now to FIG. 4F, the high-power RF limiter 100f may be implemented and may function similarly to the high-power RF limiter 100e of FIG. 4C, except that the high-power RF limiter 100f may incorporate holdoff circuits 148d, 148e in the heavy limiter 102 and light limiter 124 respectively. The holdoff circuits 148*d-e* may each be implemented and may function similarly to the holdoff circuit 148*c* (FIG. 4E), e.g., incorporating NPN BJT 152*b-c* and PNP BJT 154*b-c*.

Figure 5A:
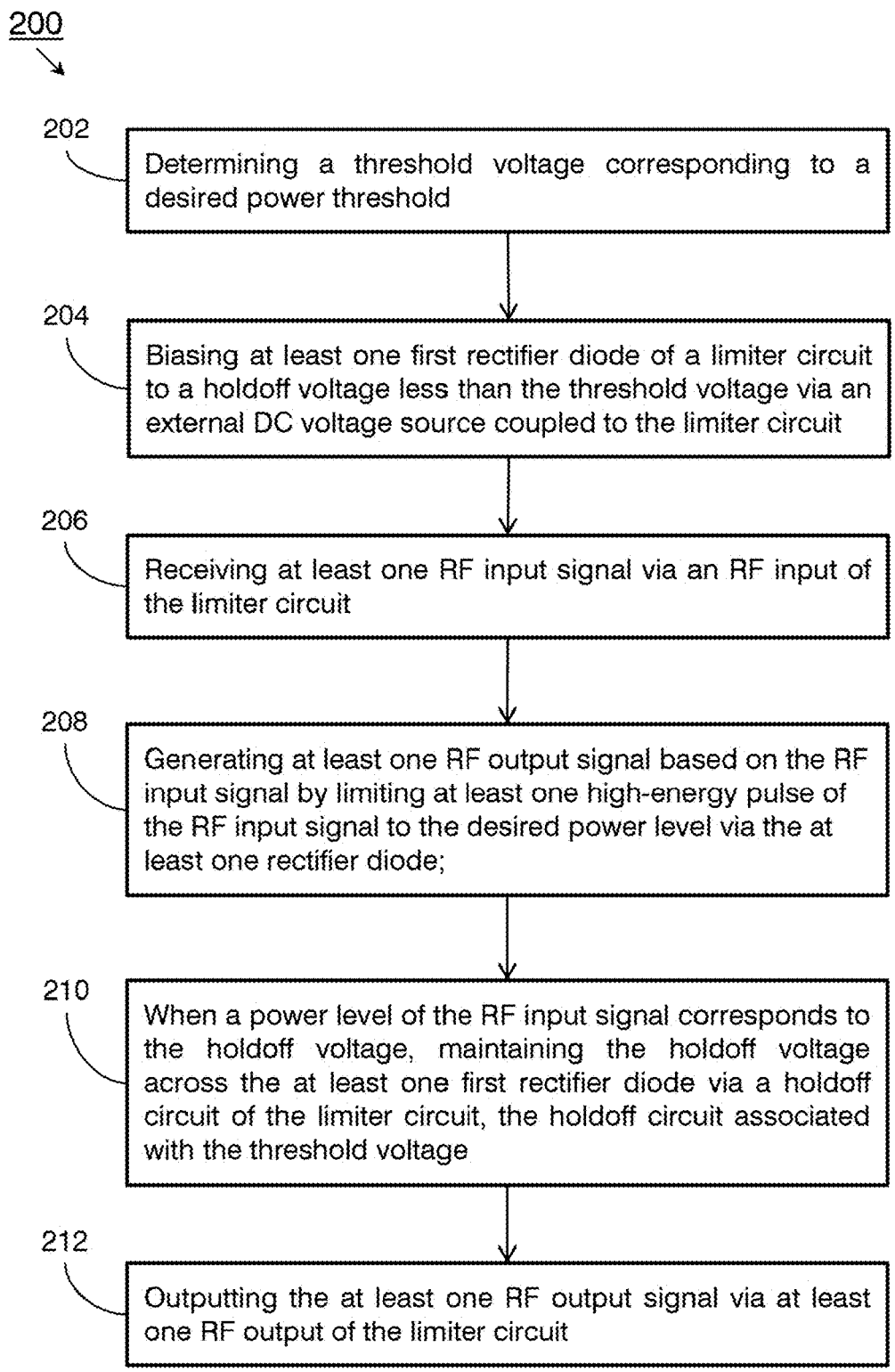

Referring to FIGS. 5A and 5B, an exemplary embodiment of a method 200 for high-power limiting of an RF input signal according to the inventive concepts disclosed herein may be implemented by the high-power RF limiter 100 in its various embodiments, and may include one or more of the following steps.

Referring in particular to FIG. 5A, at a step 202, a controller of the high-power RF limiter circuit determines a desired power threshold to which the RF input signal will be limited and a corresponding voltage threshold. For example, a desired power threshold may be selected by the controller from a group of possible power thresholds.

At a step 204, a DC bias network or voltage source biases a heavy-limiter PIN diode of the limiter circuit to a holdoff voltage just below the voltage threshold, so that the PIN diode does not activate until the power level of the RF input signal warrants activation of the heavy limiter.

At a step 206, the limiter circuit receives the RF input signal via one or more antenna elements of the receiver within which the limiter circuit is embodied.

At a step 208, the limiter circuit generates an RF output signal based on the RF input signal and limited to the desired power threshold by activating PIN diodes via a Zener diode (or similar holdoff circuit) biased to the voltage threshold. For example, the PIN diodes of a heavy limiter of a two-stage limiting circuit may be activated by high-energy pulses of the RF input signal.

At a step 210, when the power level of the RF input signal corresponds to the holdoff voltage, and the PIN diodes have switched on, the holdoff circuit may maintain the holdoff voltage across the PIN diodes, allowing the PIN diodes to self-bias (e.g., while the PIN diodes of the heavy limiter dissipate power associated with the RF input signal). For example, the appropriate Zener diodes may be selected from a bank of Zener diodes in the holdoff circuit, each Zener diode rated to a voltage corresponding to a selectable voltage threshold.

At a step 212, the limiter circuit outputs the limited RF output signal via an RF output of the RF transmission line.

Referring in particular to FIG. 5B, the method 200 may include additional steps 214, 216, and 218. At the step 214, a light limiter of the limiter circuit generates a second RF output signal based on the first RF output signal generated by the heavy limiter by reducing spike leakage associated with the PIN diodes of the heavy limiter. The PIN diodes of the light limiter may activate more quickly than those of the heavy limiter, and may be biased to a second holdoff voltage higher than the holdoff voltage of the heavy limiter (but under the voltage threshold) by the DC voltage source.

At the step 216, a second holdoff circuit of the light limiter (biased to a second voltage threshold slightly higher than the first voltage threshold associated with the heavy limiter) maintains the second holdoff voltage across the PIN diodes of the light limiter, e.g., while the PIN diodes of the light limiter are reducing spike leakage of the RF input signal while the PIN diodes of the heavy limiter are switching on.

At the step 218, the limiter circuit outputs the second RF output signal via the RF output.

As will be appreciated from the above, circuits and related methods according to embodiments of the inventive concepts disclosed herein may provide a SWaP-C favorable and quick-reacting means of guarding sensitive receiver components against damage resulting from sudden high-power pulses in received RF signals.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A high-power radio frequency (RF) limiter circuit, comprising:
   an RF signal input configured to receive at least one RF input signal;
   an RF transmission line electrically connected to the RF signal input;
   at least one rectifier diode electrically connected to the RF transmission line and biased to a first voltage by an external voltage source, the at least one rectifier diode configured to generate at least one RF output signal by limiting at least one pulse of the RF input signal to a desired power level corresponding to a second voltage greater than the first voltage;
   a holdoff circuit electronically coupled to the RF transmission line and associated with the second voltage, the holdoff circuit comprising the external voltage source and at least one Schottky diode and configured to:
      when a first power level of the at least one RF input signal corresponds to the first voltage, maintain the first voltage across the at least one rectifier diode; and
   at least one RF signal output electrically connected to the RF transmission line.

2. The high-power RF limiter circuit of claim 1, wherein the holdoff circuit comprises:
   at least one first Zener diode associated with the second voltage,
   the at least one Schottky diode configured to receive a reverse leakage current associated with the at least one first Zener diode.

3. The high-power RF limiter circuit of claim 1, wherein the external voltage source is a variable voltage source and the holdoff circuit further comprises:
   a controller electrically connected to the RF transmission line and configured to:
      select the at least one desired power level from a plurality of power levels; and
      select the at least one first voltage via the variable voltage source;
      and a voltage monitor coupled to the controller and to the RF transmission line, the voltage monitor configured to:
  detect at least one of a current power level associated with the high-power RF limiter circuit and a current voltage associated with the high-power RF limiter circuit;
  and
  report one or more of the current power level and the current voltage to the controller.

4. The high-power RF limiter circuit of claim 3, wherein the controller includes at least one of an analog controller and a digital signal processor.

5. The high-power RF limiter circuit of claim 3, wherein the holdoff circuit comprises:
  a plurality of Zener diodes coupled to the RF transmission line by a switch,
  the controller configured to connect the RF transmission line via the switch to a second Zener diode selected from the plurality of Zener diodes, the second Zener diode corresponding to the second voltage.

6. The high-power RF limiter circuit of claim 3, wherein the holdoff circuit comprises:
  at least one first NPN bipolar junction transistor (BJT) having a first collector electrically connected to the at least one first rectifier diode and a first emitter electrically connected to at least one third Zener diode, the first NPN BJT configured to select the at least one first voltage.

7. The high-power RF limiter circuit of claim 3, wherein the holdoff circuit comprises at least one shunt regulator electrically connected to the variable voltage source and configured to select the at least one first voltage.

8. The high-power RF limiter circuit of claim 3, wherein the holdoff circuit comprises:
  a second NPN BJT and a PNP BJT configured to select the at least one first voltage, the second NPN BJT having a second emitter electrically connected to a second collector of the PNP BJT and a third collector electrically connected to a base of the PNP BJT.

9. The high-power RF limiter circuit of claim 3, wherein the controller is configured to optimize the performance of the high-power RF limiter circuit based on at least one of the current power level and the current voltage by one or more of:
  adjusting an amplitude of the RF input signal via at least one attenuator electrically coupled to the controller;
  switching a receiver path associated with the RF input signal to at least one of a low-sensitivity path and a high third-order intercept point (IP3);
  switching at least one antenna associated with the RF input signal from a first antenna to a second antenna;
  switching at least one frequency band associated with the RF input signal from a first frequency band to a second frequency band;
  activating at least one of a clamping circuit coupled to the RF transmission line and an inactive rectifier diode coupled to the RF transmission line;
  and
  detecting at least one periodicity based on the at least one current power level.

10. The high-power RF limiter circuit of claim 1, wherein the at least one rectifier diode includes at least one of a limiting diode and a PIN diode.

11. The high-power RF limiter circuit of claim 1, wherein the first voltage is a positive voltage and:

the at least one rectifier diode includes a first anode electrically connected to the RF input and a first cathode electrically connected to a ground;
and
the at least one Schottky diode includes a second cathode electrically connected to the RF transmission line.

12. The high-power RF limiter circuit of claim 1, wherein the first voltage is a negative voltage and:
  the first anode is electrically connected to the ground;
  the first cathode is electrically connected to the ground;
  and
  the at least one Schottky diode includes a second anode electrically connected to the RF transmission line.

13. The high-power RF limiter circuit of claim 1, wherein the at least one rectifier diode is a first rectifier diode, the holdoff circuit is a first holdoff circuit, and the RF output signal is a first output signal, comprising:
  a first limiting stage electrically coupled to the RF signal input, the first limiter stage comprising the at least one first rectifier diode and the first holdoff circuit and configured to generate the at least one first RF output signal;
  and
  at least one second limiting stage electrically coupled to the first limiter stage and coupled to generate at least one second RF output signal based on the first RF output signal, the at least one second limiter stage comprising:
    at least one second rectifier diode biased by the external voltage source to a third voltage between the first voltage and the second voltage, the at least one second rectifier diode configured to generate the at least one second RF output signal by reducing spike leakage associated with the first limiter stage;
    and
    a second holdoff circuit electrically connected to the at least one second rectifier diode and associated with a fourth voltage corresponding to a second power level greater than the desired power level, the second holdoff circuit configured to, when a third power level of the at least one first RF input signal corresponds to the third voltage, maintain the third voltage across the at least one second rectifier diode.

14. The high-power RF limiting circuit of claim 13, wherein:
  the first limiting stage is electrically connected to one or more of the RF signal input and the second limiting stage by one or more of a first decoupling capacitor and a first impedance matching network;
  the second limiting stage is electrically connected to one or more of the first limiting stage and the RF signal output by one or more of a second decoupling capacitor and a second impedance matching network.

15. The high-power RF limiter circuit of claim 1, wherein the circuit is embodied in a receiving device configured to receive the at least one RF input signal.

16. A method for high-power RF limiting, the method comprising:
  determining a threshold voltage corresponding to a desired power level;
  biasing at least one rectifier diode of a limiter circuit to a holdoff voltage less than the threshold voltage via an external DC voltage source coupled to the limiter circuit;
  receiving at least one RF input signal via an RF input of the limiter circuit;

generating at least one RF output signal based on the RF input signal by limiting at least one high-energy pulse of the RF input signal to the desired power level via the at least one rectifier diode;

when a power level of the RF input signal corresponds to the holdoff voltage, maintaining the holdoff voltage across the at least one first rectifier diode via a holdoff circuit of the limiter circuit, the holdoff circuit associated with the threshold voltage; and outputting the at least one RF output signal via at least one RF output of the limiter circuit.

17. The method of claim 16, wherein:
generating at least one RF output signal based on the RF input signal by limiting at least one high-energy pulse of the RF input signal to the desired power level via the at least one rectifier diode includes:
activating the at least one rectifier diode via a Zener diode of the holdoff circuit, the Zener diode corresponding to the threshold voltage.

18. The method of claim 17, wherein:
determining a threshold voltage corresponding to a desired power level includes:
selecting the desired power level from a plurality of power levels via a controller of the limiter circuit; and
when a power level of the RF input signal corresponds to the holdoff voltage, maintaining the holdoff voltage across the at least one first rectifier diode via a holdoff circuit of the limiter circuit, the holdoff circuit associated with the threshold voltage includes:
selecting the threshold voltage from a plurality of voltages via the controller.

19. The method of claim 16, wherein the RF output signal is a first RF output signal, the at least one rectifier diode is a first rectifier diode, the holdoff circuit is a first holdoff circuit, the holdoff voltage is a first holdoff voltage and the threshold voltage is a first threshold voltage, further comprising:
generating at least one second RF output signal based on the first RF output signal by reducing spike leakage associated with the at least one first rectifier diode via at least one second rectifier diode of the limiter circuit, the at least one second rectifier diode biased to a second holdoff voltage between the first holdoff voltage and the first threshold voltage by the external DC voltage source;
maintaining a second holdoff voltage across the at least one second rectifier diode via a second holdoff circuit of the limiter circuit, the second holdoff circuit associated with a second threshold voltage greater than the first threshold voltage; and
outputting the at least one second RF output signal via the at least one RF output.

20. The method of claim 19, wherein:
generating at least one second RF output signal based on the first RF output signal by reducing spike leakage associated with the at least one first rectifier diode via at least one second rectifier diode of the limiter circuit, the at least one second rectifier diode biased to a second holdoff voltage between the first holdoff voltage and the first threshold voltage by the external DC voltage source includes:
selecting the at least one second holdoff voltage from a plurality of voltages via the controller; and
maintaining a second holdoff voltage across the at least one second rectifier diode via a second holdoff circuit of the limiter circuit, the second holdoff circuit associated with a second threshold voltage greater than the first threshold voltage includes:
selecting the at least one second threshold voltage from a plurality of voltages via the controller.

* * * * *